(12) United States Patent
Chang et al.

(10) Patent No.: US 8,564,759 B2
(45) Date of Patent: Oct. 22, 2013

(54) APPARATUS AND METHOD FOR IMMERSION LITHOGRAPHY

(75) Inventors: Ching-Yu Chang, Yilang County (TW); Burn Jeng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 643 days.

(21) Appl. No.: 11/697,469

(22) Filed: Apr. 6, 2007

(65) Prior Publication Data

US 2008/0002164 A1   Jan. 3, 2008

Related U.S. Application Data

(63) Continuation-in-part of application No. 11/427,421, filed on Jun. 29, 2006.

(51) Int. Cl.
*G03B 27/42* (2006.01)

(52) U.S. Cl.
USPC .............................................. 355/53; 355/30

(58) Field of Classification Search
USPC ....................................... 355/30, 53
See application file for complete search history.

(56) References Cited

U.S. PATENT DOCUMENTS

| | | | |
|---|---|---|---|
| 4,480,910 A | 11/1984 | Takanashi et al. |
| 4,509,852 A | 4/1985 | Tabarelli et al. |
| 5,132,560 A | 7/1992 | Kane |
| 5,134,632 A | 7/1992 | Fletcher et al. |
| 5,457,489 A | 10/1995 | Yamamoto et al. |
| 6,169,765 B1 | 1/2001 | Holcombe |
| 6,232,796 B1 | 5/2001 | Batra et al. |
| 6,496,257 B1 | 12/2002 | Taniguchi et al. |
| 6,724,460 B2 | 4/2004 | Van Schaik et al. |
| 6,781,670 B2 | 8/2004 | Krautschik |
| 6,781,685 B2 | 8/2004 | Hamm |
| 6,784,972 B2 | 8/2004 | Nagahashi et al. |
| 6,788,477 B2 | 9/2004 | Lin |
| 6,809,794 B1 | 10/2004 | Sewell et al. |
| 6,828,569 B2 | 12/2004 | Van Schaik et al. |
| 7,119,035 B2 | 10/2006 | Ho et al. |
| 7,224,427 B2 | 5/2007 | Chang et al. |
| 7,317,504 B2 | 1/2008 | DeSmit et al. |

(Continued)

FOREIGN PATENT DOCUMENTS

| EP | 1486827 A2 | 12/2004 |
|---|---|---|
| EP | 1562080 A1 | 8/2005 |

(Continued)

OTHER PUBLICATIONS

Japanese Patent Office, Japanese Office Action mailed Mar. 26, 2009, 4 pages, Japanese Application No. 2006-287405.

(Continued)

*Primary Examiner* — Toan Ton
*Assistant Examiner* — Mesfin T Asfaw
(74) *Attorney, Agent, or Firm* — Haynes and Boone, LLP

(57) ABSTRACT

A lithography apparatus includes an imaging lens module, a substrate table positioned underlying the imaging lens module and configured to hold a substrate, and a cleaning module adapted to clean the lithography apparatus. The cleaning module comprises one inlet and one outlet for providing a cleaning fluid to and from a portion of the lithography apparatus to be cleaned, and an ultrasonic unit configured to provide ultrasonic energy to the cleaning fluid.

20 Claims, 14 Drawing Sheets

(56) References Cited

U.S. PATENT DOCUMENTS

| | | | |
|---|---|---|---|
| 7,370,659 | B2 | 5/2008 | Hickman et al. |
| 7,385,670 | B2 * | 6/2008 | Compen et al. ............... 355/30 |
| 7,986,395 | B2 | 7/2011 | Chang et al. |
| 8,054,444 | B2 | 11/2011 | Lin et al. |
| 2004/0118184 | A1 | 6/2004 | Violette |
| 2004/0147204 | A1 | 7/2004 | Sakai |
| 2005/0028314 | A1 | 2/2005 | Hickman et al. |
| 2005/0051739 | A1 | 3/2005 | Van Der Net et al. |
| 2005/0078286 | A1 | 4/2005 | Dierichs et al. |
| 2005/0106512 | A1 | 5/2005 | Endo et al. |
| 2005/0225734 | A1 | 10/2005 | De Smit et al. |
| 2006/0023185 | A1 | 2/2006 | Hazelton et al. |
| 2006/0033898 | A1 | 2/2006 | Cadee et al. |
| 2006/0050351 | A1 | 3/2006 | Higashiki |
| 2006/0102277 | A1 | 5/2006 | Zaal et al. |
| 2006/0132731 | A1 * | 6/2006 | Jansen et al. ............... 355/30 |
| 2006/0154188 | A1 | 7/2006 | Hirayama et al. |
| 2006/0250588 | A1 | 11/2006 | Brandl |
| 2006/0250591 | A1 | 11/2006 | Straaijer |
| 2007/0002299 | A1 * | 1/2007 | Imai et al. ............... 355/55 |
| 2007/0004234 | A1 | 1/2007 | Goodwin et al. |
| 2012/0038894 | A1 | 2/2012 | Lin et al. |

FOREIGN PATENT DOCUMENTS

| | | |
|---|---|---|
| JP | 2005-072404 | 3/2005 |
| WO | WO 2004/093130 A2 | 10/2004 |
| WO | WO 2004/093130 A3 | 10/2004 |
| WO | WO 2004/105107 A1 | 12/2004 |

OTHER PUBLICATIONS

Australian Patent Office, Written Opinion for Application No. SG 200605034-8, May 6, 2009, 5 pages.

Office Action issued in related U.S. Appl. No. 11/427,421, filed Jun. 29, 2009, 12 pages.

Lin, Burn J., "Semiconductor Foundry, Lithography, and Partners," Proc. SPIE (The International Society for Optical Engineering), vol. 2688, Jul. 2002, pp. 11-24.

Owa, Solchi, et al., "Immersion Lithography; Its Potential Performance and Issues," Proc. SPIE (The International Society for Optical Engineering), vol. 5040, Jun. 2003, pp. 724-733.

Switkes, M., et al., "Immersion Lithography at 157 nm," Journal of Vacuum Science & Technology B: Microelectronics and nanometer Structures, vol. 19, Issue 6, Nov. 2001, pp. 2353-2356.

Ching-Yu Chang, Burn Jeng Lin and Chin-Hsiang Lin; "Immersion Lithography Apparatus and Methods;" U.S. Appl. No. 60/729,565, filed Oct. 24, 2005; 38 Pages.

Japanese Office Action, Dated Mar. 26, 2009, for Japanese Application No. 2006-287405, Mamoru Ushiki et al, 4 Pages.

Ching-Yu Chang and Burn Jeng Lin, "Immersion Lithography Apparatus and Methods," U.S. Appl. No. 11/427,421, filed Jun. 29, 2006, 37 Pages.

* cited by examiner

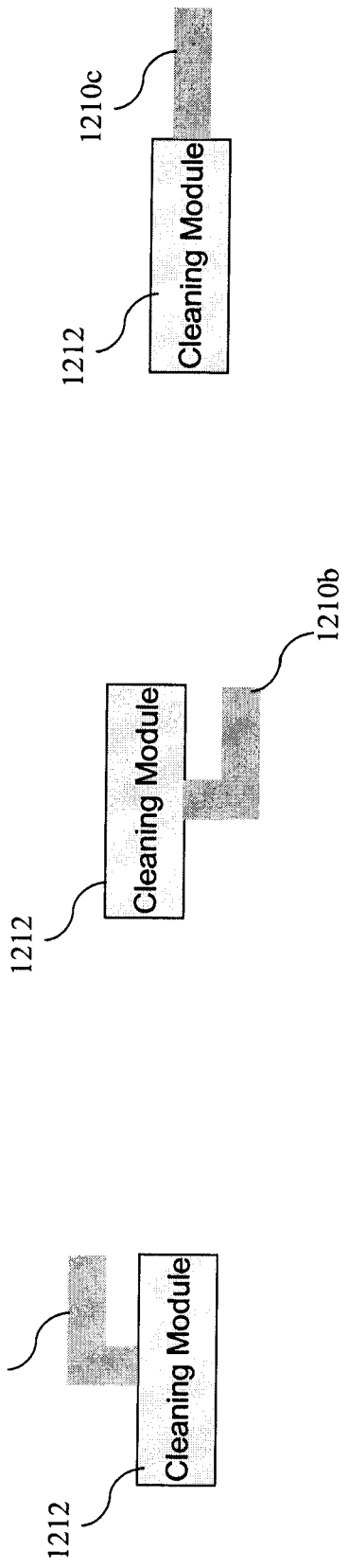

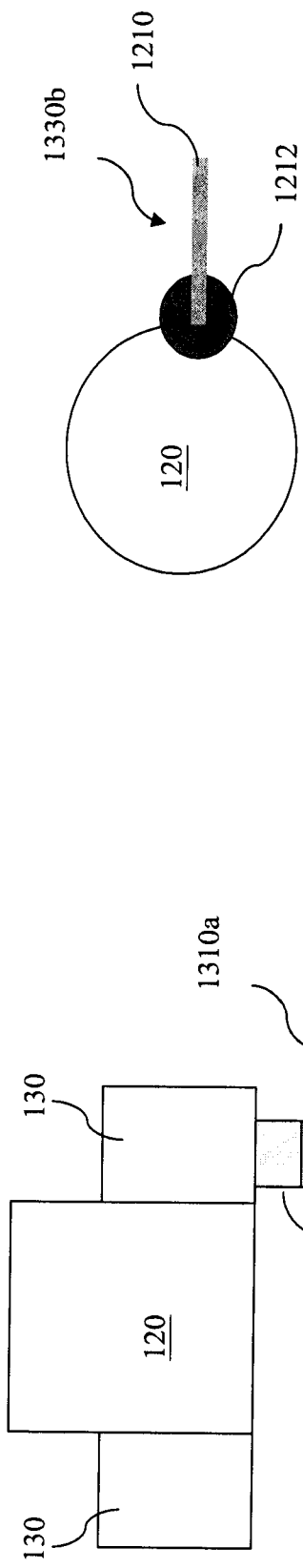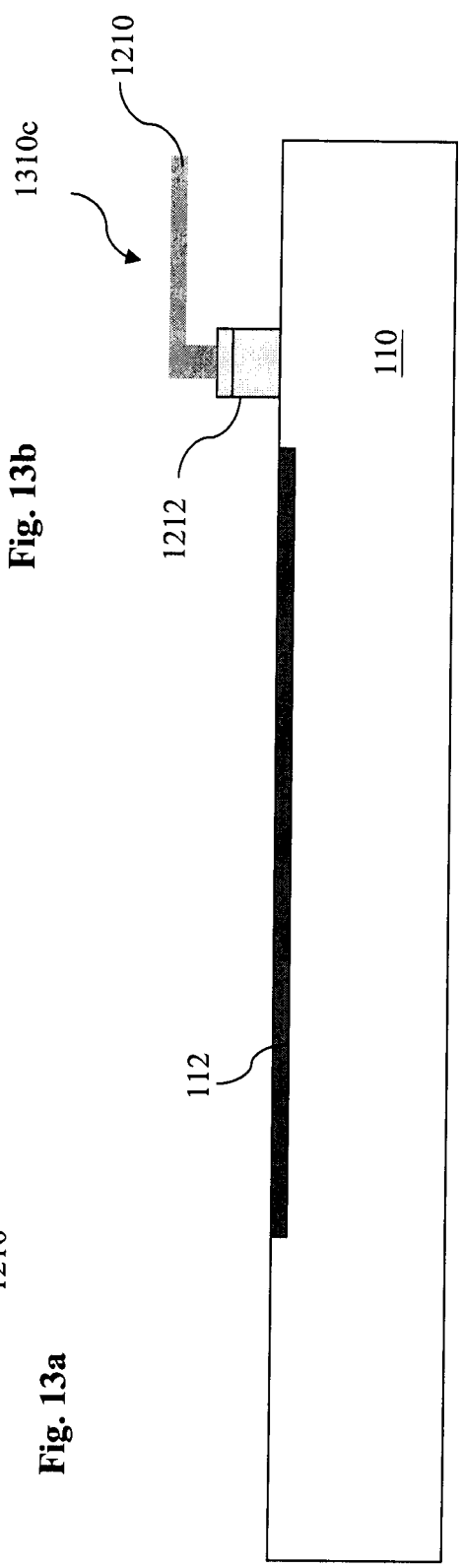
Fig. 13a
Fig. 13b
Fig. 13c

APPARATUS AND METHOD FOR IMMERSION LITHOGRAPHY

The present disclosure is a continuation-in-part of U.S. Ser. No. 11/427,421, filed Jun. 29, 2006, the contents of which are hereby incorporated by reference.

BACKGROUND

The present disclosure relates generally to photolithography systems and, more particularly, to a cleaning apparatus and method for use in a liquid immersion lithography process.

As semiconductor fabrication technologies are continually progressing to smaller feature sizes such as 65 nanometers, 45 nanometers, and below, immersion lithography methods are being adopted. However, during an exposure process using an immersion lithography system, contaminations such as particles and water residues can be introduced into the immersion lithography system and further contaminate semiconductor wafers to be processed therein. Such contamination can cause defects and yield degradations.

Therefore, what is needed is a simple and cost-effective apparatus and method to clean the immersion lithography system.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 12a through 12c illustrate schematic views of various embodiments of a robot incorporating one of the cleaning modules of FIGS. 5 through 10.

FIGS. 13a through 13c illustrate schematic views of various embodiments of utilizing one of the robots of FIGS. 12a through 12c to clean various components of the immersion lithography system of FIG. 1.

DETAIL DESCRIPTION

Figure 1:
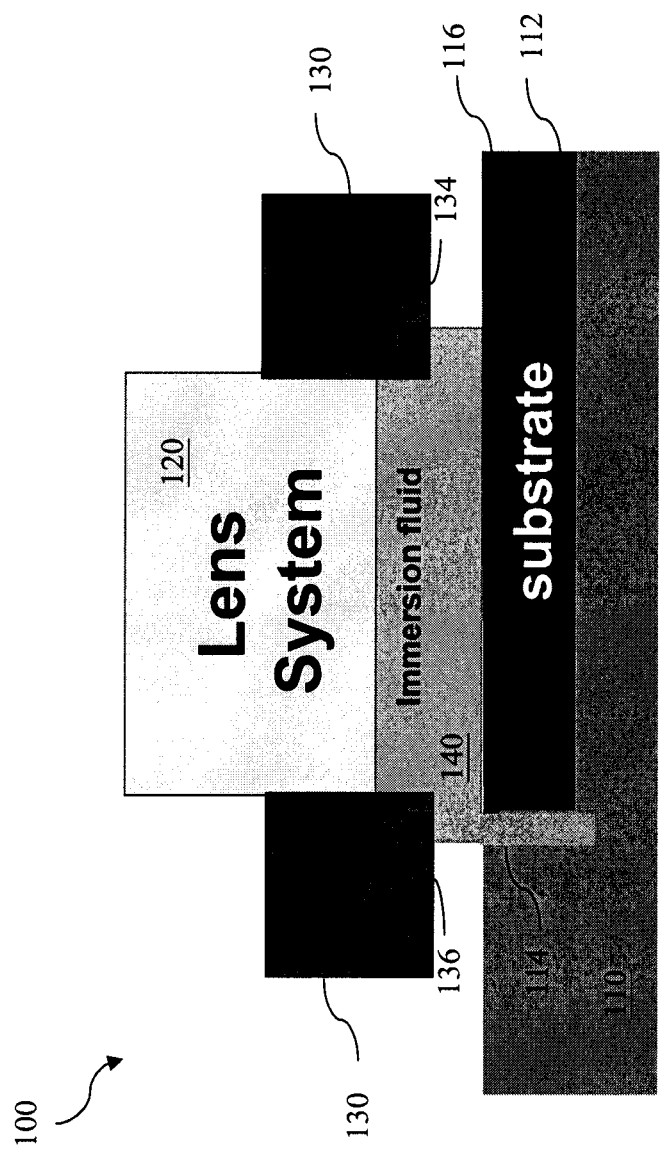
FIG. 1 illustrates a schematic view of a conventional immersion lithography system.

It is understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a schematic view of a conventional immersion lithography system 100. The system 100 includes a substrate table 110 to hold a substrate 112 to be processed by the system 100 for patterning. The substrate table 110 can be a substrate stage or include a substrate stage as a part thereof. The substrate table 110 may include a substrate edge trench 114. The substrate table 110 is operable to secure and move the substrate 112 relative to the system 100. For example, the substrate table 110 may be designed to be capable of translational and/or rotational displacement for substrate alignment, stepping, and scanning. The substrate table 110 may include various components suitable to perform precise movement.

The substrate 112 to be held by the substrate table 110 and processed by the system 100 may be a semiconductor wafer such as a silicon wafer. Alternatively, the semiconductor wafer may include an elementary semiconductor, a compound semiconductor, an alloy semiconductor, or combinations thereof. The semiconductor wafer may include one or more material layers such as poly-silicon, metal, and/or dielectric, to be patterned. The substrate 112 may further include an imaging layer 116 formed thereon. The imaging layer 116 can be a photoresist layer (resist layer, photo sensitive layer, patterning layer) that is responsive to an exposure process for creating patterns. The imaging layer 116 may be a positive or negative type resist material and may have a multi-layer structure. One exemplary resist material is chemical amplifier (CA) resist.

The immersion lithography system 100 includes one or more imaging lens systems (referred to as a "lens system") 120. The semiconductor wafer may be positioned on a substrate table 110 under the lens system 120. The lens system 120 may further include or be integral to an illumination system (e.g., a condenser) which may have a single lens or multiple lenses and/or other lens components. For example, the illumination system may include microlens arrays, shadow masks, and/or other structures. The lens system 120 may further include an objective lens which may have a single lens element or a plurality of lens elements. Each lens element may include a transparent substrate and may further include a plurality of coating layers. The transparent substrate may be a conventional objective lens, and may be made of fused silica (SiO2), calcium-fluoride (CaF2), lithium fluoride (LiF), barium fluoride (BaF2), or other suitable material. The materials used for each lens element may be chosen based on the wavelength of light used in the lithography process to minimize absorption and scattering.

The system 100 includes an immersion fluid retaining module 130 for holding a fluid 132 such as an immersion fluid. The immersion fluid retaining module 130 may be positioned proximate (such as around) the lens system 120 and designed for other functions, in addition to holding the immersion fluid. The immersion fluid retaining module 130 and the lens system 120 make up (at least in part) an immersion head or hood. The immersion fluid may include water (water solution or de-ionized water-DIW), high n fluid (n is index of refraction, the n value at 193 nm wavelength here is larger than 1.44), gas, or other suitable fluid.

The immersion fluid retaining module 130 may include various apertures (or nozzles) for providing the immersion fluid for an exposure process. Particularly, the module 130 may include an aperture 134 as an immersion fluid inlet to provide and transfer the immersion fluid into a space 140 between the lens system 120 and the substrate 112 on the substrate table 110. The module 130 may also include an aperture 136 as an immersion fluid outlet to remove and transfer the immersion fluid from the space 140. It is understood that the immersion fluid may be provided to and from the space 140 at a sufficient rate by components suitable for this type of movement.

The immersion lithography system 100 may further include a radiation source (not shown). The radiation source may be a suitable ultraviolet (UV) or extra UV (EUV) light source. For example, the radiation source may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride (F2) excimer laser with a wavelength of 157 nm; or other light sources having a desired wavelength (e.g., below approximately 100 nm).

A photomask (also referred to as a mask or a reticle) may be introduced into the system 100 during an immersion lithography process. The mask may include a transparent substrate and a patterned absorption layer. The transparent substrate may use fused silica ($SiO2$) relatively free of defects, such as borosilicate glass and soda-lime glass. The transparent substrate may use calcium fluoride and/or other suitable materials. The patterned absorption layer may be formed using a plurality of processes and a plurality of materials, such as depositing a metal film made with chromium (Cr) and iron oxide, or an inorganic film made with MoSi, ZrSiO, SiN, and/or TiN.

Figure 2:
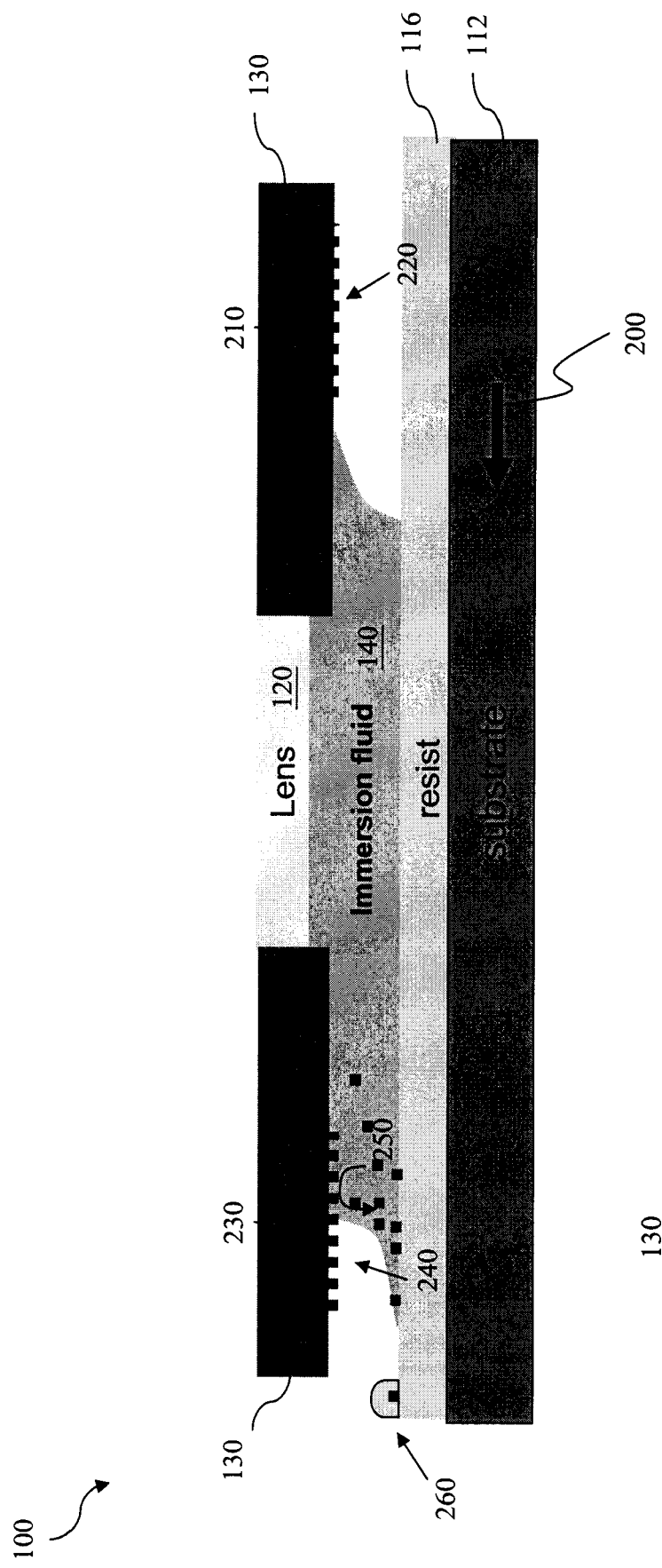
FIG. 2 illustrates a schematic view of contaminations such as particles and water residues being introduced into the immersion lithography system of FIG. 1.

Now referring also to FIG. 2, illustrated is a schematic view of contaminations such as particles and water residues being introduced into the immersion lithography system of FIG. 1. Similar features in FIGS. 1 and 2 are numbered the same for simplicity and clarity. During an exposure process with the immersion lithography system 100, the immersion fluid may be held inside the space 140 between the lens system 120 and the substrate 112 by a water control feature. The resist layer 116 may leach various chemicals and/or introduce particles (e.g., peeling defect from resist film) into the immersion fluid. Additionally, other particles from the substrate 112 and/or system 100 may also be introduced into the immersion fluid. Following the exposure process, the substrate table 110 may be moved 200 to perform another exposure process at a next location on the substrate 112.

An area 210 of the immersion fluid retaining module 130 that was previously wet from contact with the immersion fluid may now be partly dry. However, the surface area 210 may retain water drops from the immersion fluid. Some of these water drops may contain chemicals and/or particles that were previously introduced into the immersion fluid and may become particle stains 220 that may adhere to the area 210 when the water drop evaporates. Another area 230 of the immersion fluid retaining module 130 (on the opposite side of the lens system 120) that was previously dry may now be wet from contact with the immersion fluid. The particle stains 240 (that were previously formed from evaporated dirty water drops) on this area 230 may trap additional dirty water drops and may become larger when the water drops evaporate again. This type of particle stain formation may be most prevalent at the wet/dry interface areas of the system 100 and may repeat itself as the substrate table 110 is moved to process the entire substrate 112. Eventually, these particle stains 220, 240 may become large enough and peel or lift off 250 during processing. Additionally, other particles stains 260 may be generated by dirty water drops that are left behind from a tailing effect of the immersion fluid as the substrate table 110 is moved during processing. These particle stains 220, 240, 260 may result in real defects on the substrate 112 and thus, may lead to low yield.

Figure 3B:
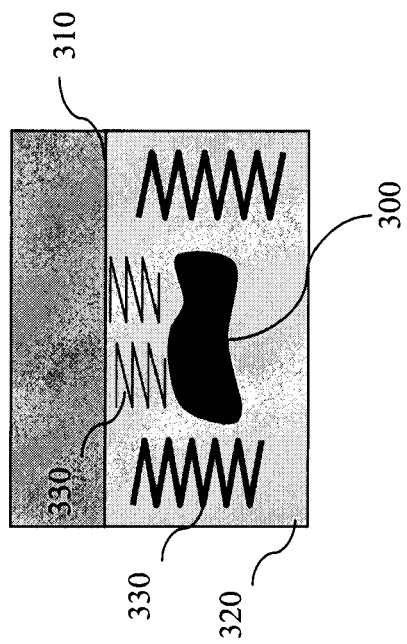
FIGS. 3a and 3b illustrate schematic views of a cleaning mechanism utilizing acoustic energy.
Figure 3A:
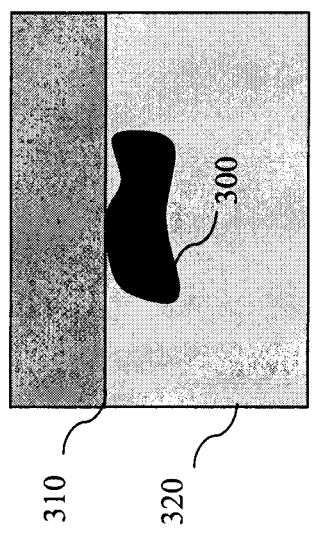

Now referring to FIGS. 3a and 3b, illustrated is a cleaning mechanism using acoustic energy, such as ultrasonic energy (or referred to as megasonic energy for very high frequencies). A particle stain 300 may be formed and adhered to a surface area 310 as was discussed in FIG. 2. The surface area 310 may be subjected to a cleaning fluid 320. The cleaning fluid 320 may be provided with an ultrasonic or megasonic energy 330 which causes the particle stain 300 to peel or lift off the surface area 310. The cleaning fluid 320 may be removed along with the particle stain 300 from the surface area 310.

Figure 4B:
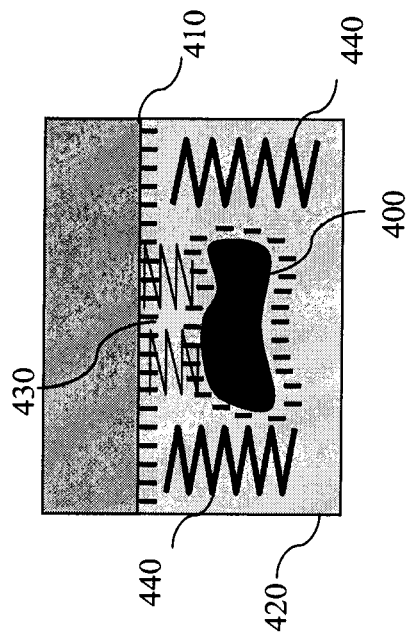
FIGS. 4a and 4b illustrate schematic views of another cleaning mechanism utilizing acoustic energy and a chemical solution.
Figure 4A:
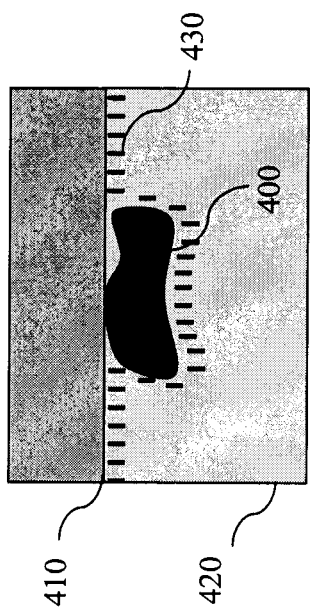

Now referring to FIGS. 4a and 4b, illustrated is another cleaning mechanism using acoustic energy, such as ultrasonic energy (or referred to as megasonic energy for very high frequencies), with a chemical solution. A particle stain 400 may be formed and adhered to a surface area 410 as was discussed in FIG. 2. The surface area 410 may be subjected to a cleaning fluid 420 that may include a chemical solution. The chemical solution may generate charged ions 430 that form a layer on the surface area 410 and the particle stain 400. In the present example, the charged ions are negatively-charged but it is understood that the charged ions may be positively-charged. The cleaning fluid 420 may be provided with an ultrasonic or megasonic energy 440 which causes the particle stain 400 to peel or lift off the surface area 410. The negatively-charged layer on the particle stain 400 will repel it from the negatively-charged layer on the surface area 410. This will prevent the particle stain 400 from re-depositing on the surface area 410 and thus, will improve the particle removal process. The cleaning fluid 420 may be removed along with the particle stain 400 from the surface area 410.

Figure 5:
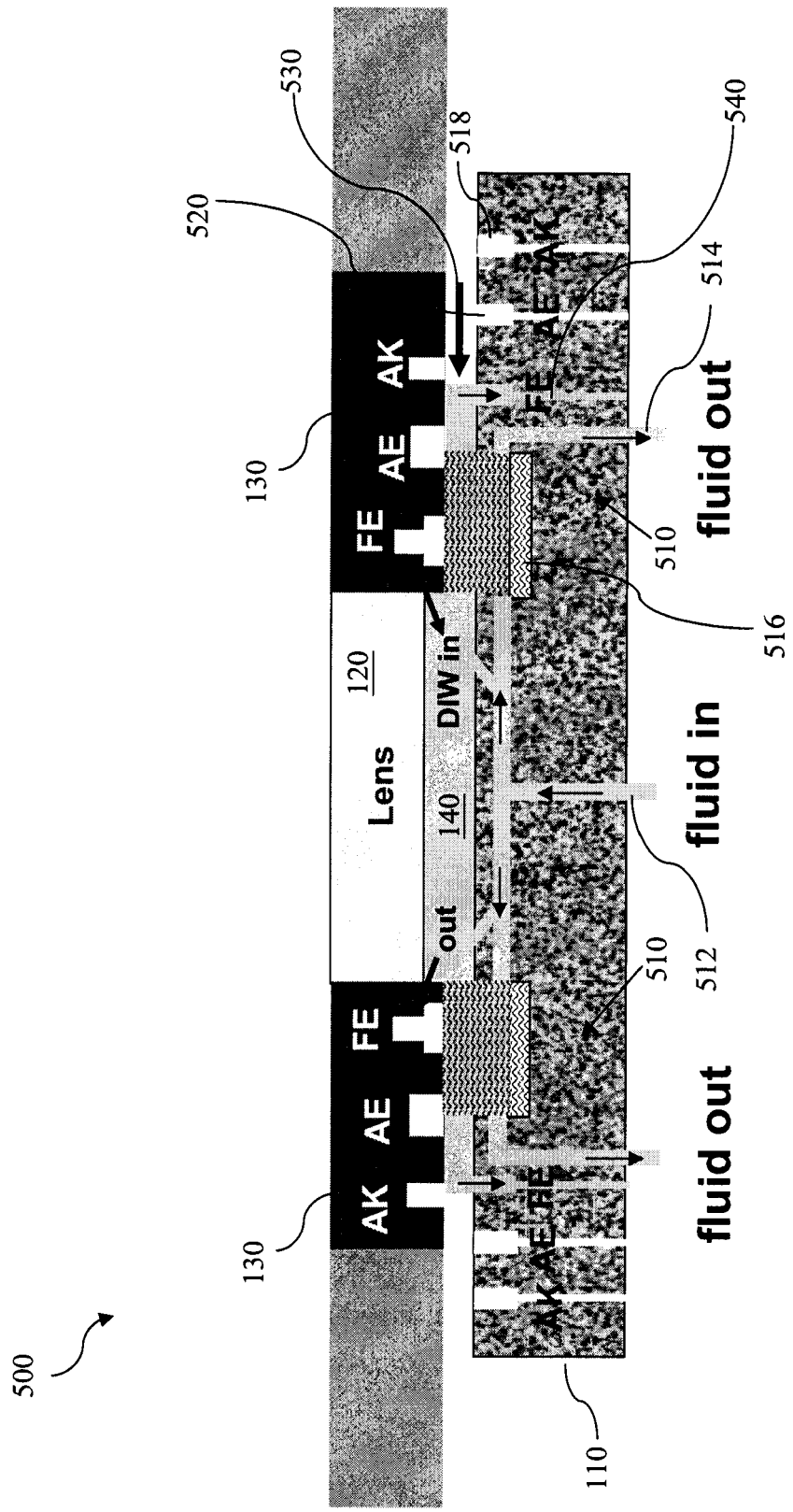
FIGS. 5 through 7 illustrate schematic views of various embodiments of an immersion lithography system having a cleaning module.

Now referring to FIG. 5, illustrated is one embodiment of an immersion lithography system 500 having a cleaning module 510. The immersion lithography system 500 may be substantially similar to the system 100 of FIG. 1. However, the system 500 has a separate cleaning module 510 incorporated therewith. Similar features in FIGS. 1 and 5 are numbered the same for simplicity and clarity. The cleaning module 510 may be integrated with the substrate table 110. Accordingly, the cleaning module 510 may be precisely moved and controlled via the substrate table 110 to clean the wet/dry interface areas of the system 500, such as around the lens system 120 and the immersion fluid retaining module 130. Alternatively, the cleaning module 510 may be configured as a separate apparatus and may be operable to clean the system 500 online and/or offline. The cleaning module 510 may comprise at least one fluid inlet 512 and at least one fluid outlet 514 for providing a cleaning fluid to and from a portion of the system 500 to be cleaned. The inlet 512 and outlet 514 may be controlled by valves and pumps such that a flow of cleaning fluid may be provided to the portion of the system 500 to be cleaned. The time period for the flow of cleaning fluid may vary depending on the cleaning recipe implemented. The cleaning module 510 may be positioned between 0.1 mm to about 1 cm away from the cleaning target so as not to damage the system 500. The cleaning fluid may include de-ionized water (DIW), $CO_2$ water, or other various cleaning solutions. The various cleaning solutions may include, but are not limited to, ionic surfactant, non ionic surfactant, solvent, $NH_4OH$, $H_2O_2$, $O_3$, PGME/PGMEA (propylene glycol monomethyl ether/propylene glycol monomethyl ether acetate), cyclohexanol, Isopropyl alcohol (IPA), acetone, alcohol, monoethanolamine (MEA), and combinations thereof. The cleaning fluid may be maintained at temperature range from about 23° C. to about 70° C.

The cleaning module 510 may further include an ultrasonic unit 516 operable to introduce ultrasonic energy to the cleaning fluid provided to the portion of the system 500 to be cleaned. The ultrasonic unit 516 may be configured to be incorporated with the substrate table 110 and spaced 1 cm from the cleaning target. The ultrasonic unit 516 is configured to provide ultrasonic energy for efficient cleaning of particle stains present in the system 500. For example, the ultrasonic unit 516 may include ultrasonic generators that convert electrical energy to ultrasonic energy through piezoelectric elements know in the art. The ultrasonic unit 516 may include piezoelectric materials such as quartz crystals, barium titanate, ceramic piezoelectric materials, and other suitable materials. The ultrasonic unit 516 may be designed to be operable to produce ultrasonic energy at a frequency ranging between about 1 KHz and 1 GHz. The ultrasonic unit 516 are able to deliver an ultrasonic power to the cleaning fluid effective for cleaning. The delivered ultrasonic power may range between about 10 watt to 1000 watt. The ultrasonic power and frequency may be tunable according to a given recipe or for various cleaning requirements and performances. Furthermore, the ultrasonic power and frequency may be tuned so as not to damage components of the immersion lithography system 500, such as the lens system 120.

The cleaning module 510 may further include at least one air knife (AK) 518 and at least one air extractor (AE) 520 for providing hydrodynamic control of the cleaning fluid flowed into the space between the substrate table 110 and the immersion fluid retaining module 130 during cleaning. The air knife 518 and air extractor 520 may work together to provide an adequate air pressure 530 to prevent the cleaning fluid from escaping the cleaning space. Alternatively, the air knife 518 and air extractor 520 may optionally be used to dry components of the system 500 after the cleaning. The cleaning module 510 may further include a fluid extractor (FE) 540 to provide additional cleaning fluid suction to prevent the cleaning fluid form escaping the cleaning space. During cleaning, the cleaning fluid may be circulated through the cleaning space so that contaminations such as particle stains may be removed from the system 500 via the outlet 514. Even though the cleaning module 510 is shown cleaning the immersion fluid retaining module 130, it is understood that the cleaning module may be moved to various locations to clean other components of the system 500.

Figure 6:
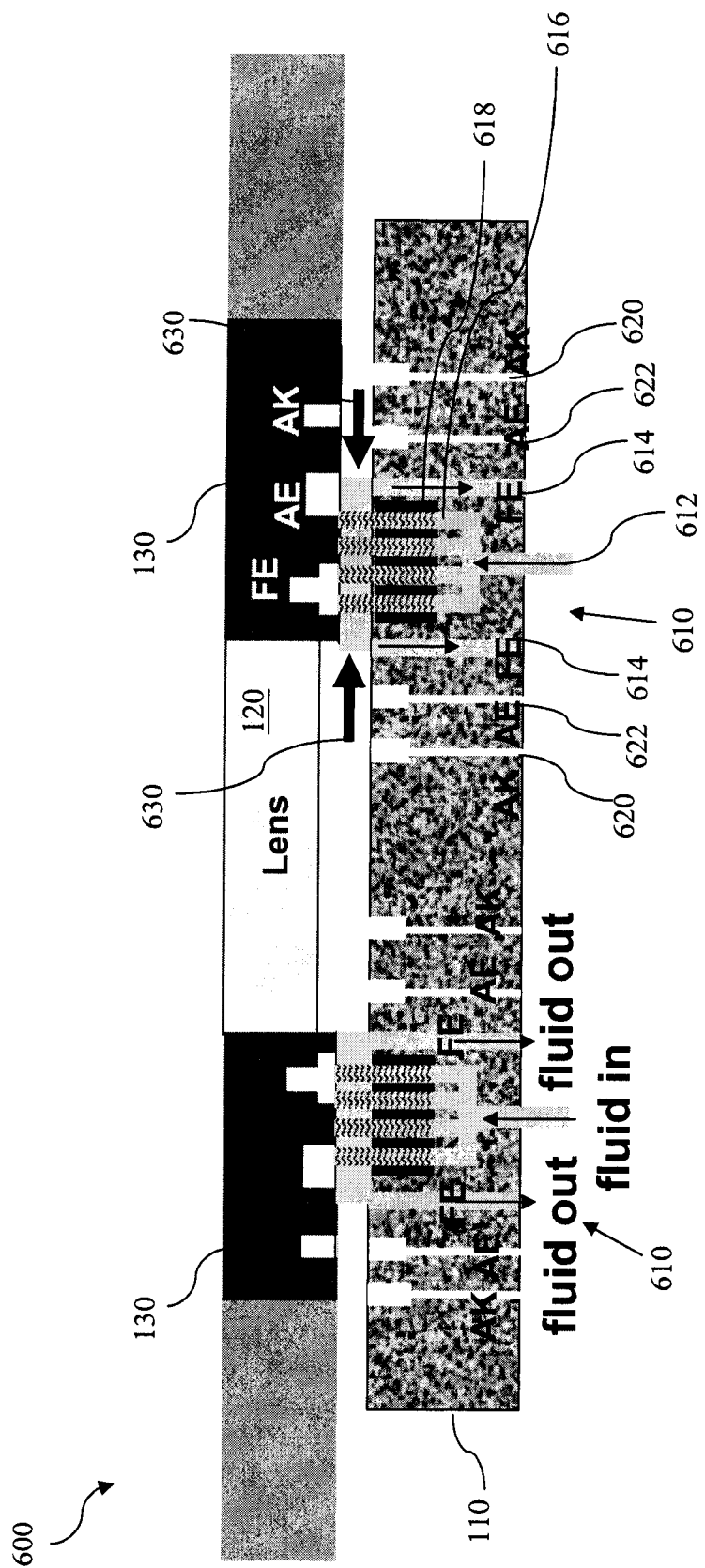

Now referring to FIG. 6, illustrated is another embodiment of an immersion lithography system 600 having a cleaning module 610. The immersion lithography system 600 may be substantially similar to the system 100 of FIG. 1. However, the system 600 has a separate cleaning module 610 incorporated therewith. Similar features in FIGS. 1 and 6 are numbered the same for simplicity and clarity. The cleaning module 610 may be integrated with the substrate table 110. Accordingly, the cleaning module 610 may be precisely moved and controlled via the substrate table 110 to clean the wet/dry interface areas of the system 600, such as around the lens system 120 and the immersion fluid retaining module 130. Alternatively, the cleaning module 610 may be configured as a separate apparatus and may be operable to clean the system 600 online and/or offline. The cleaning module 610 may comprise at least one fluid inlet 612 and a pair of fluid outlets 614, such as fluid extractors (FE), for providing a cleaning fluid to and from a portion of the system 600 to be cleaned. The inlet 612 and outlets 614 may be controlled by valves and pumps such that a flow of cleaning fluid may be provided to the portion of the system 600 to be cleaned. The time period of the flow of cleaning fluid may vary depending on the cleaning recipe. The cleaning module 610 may be positioned between 0.1 mm to about 1 cm away from the cleaning target so as not to damage the system 600. The cleaning fluid may be substantially the same as was discussed in FIG. 5.

The inlet 612 may be split into a plurality of channels 616 to form a plurality of nozzles having a jet-like configuration. It is understood that the number of channels may vary depending on cleaning and performance requirements. Each channel 616 may incorporate a pair of ultrasonic plates 618 (one on either side of the channel) for providing ultrasonic energy to the cleaning fluid for efficient cleaning of particle stains present in the system 600. The ultrasonic plates 618 may be configured substantially the same as was discussed in FIG. 5.

The cleaning module 610 may further include a pair of air knives (AK) 620 and air extractors (AE) 622 positioned on either side of the outlets 614 as shown. The air knives 620 and air extractors 622 may provide hydrodynamic control of the cleaning fluid flowed into the space between the substrate table 110 and the immersion fluid retaining module 130 during cleaning. The air knives 620 and air extractors 622 may work together to provide an adequate air pressure 630 to prevent the cleaning fluid from escaping the cleaning space. Additionally, the air knives 620 and air extractors 622 may optionally be used to dry components of the system 600 after cleaning. Even though the cleaning module 610 is shown cleaning the immersion fluid retaining module 130, it is understood that the cleaning module may be moved to various locations to clean other components of the system 600.

Figure 7:
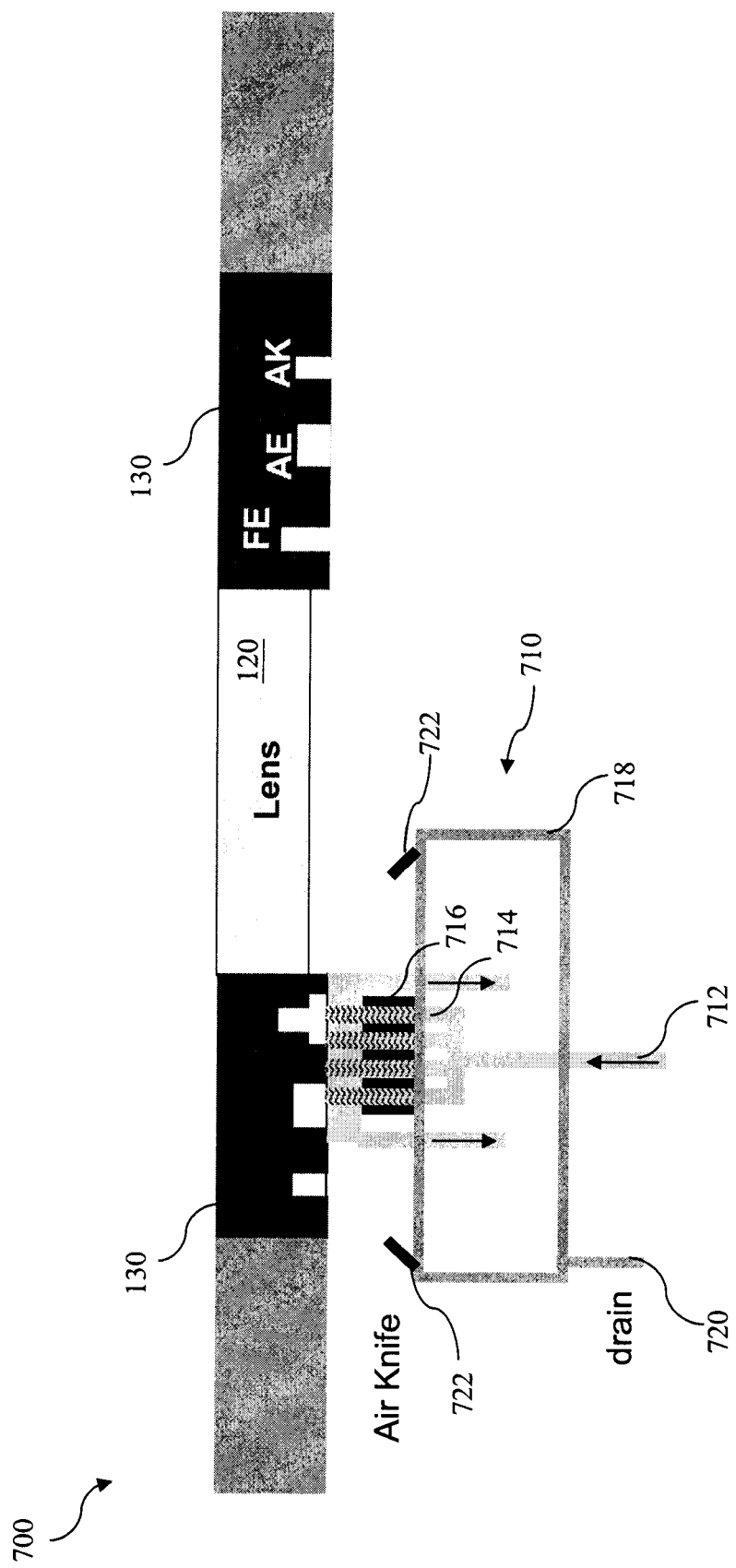

Now referring to FIG. 7, illustrated is another embodiment of an immersion lithography system 700 having a cleaning module 710. The immersion lithography system 700 may be substantially similar to the system 100 of FIG. 1. However, the system 700 has a separate cleaning module 710 incorporated therewith. Similar features in FIGS. 1 and 7 are numbered the same for simplicity and clarity. In the present embodiment, the cleaning module 710 may be configured as a separate apparatus for cleaning components of the system 700, such as the immersion hood. The cleaning module 710 may comprise at least one fluid inlet 712 for providing a cleaning fluid to a portion of the system 700 to be cleaned. The cleaning module 710 may be positioned between 0.1 mm to about 1 cm away from the cleaning target so as not to damage the system 700. The cleaning fluid may be substantially the same as was discussed in FIG. 5.

The inlet 712 may be split into a plurality of channels 714 to form a plurality of nozzles having a jet-like configuration. It is understood that the number of channels may vary depending on cleaning and performance requirements. Each channel 714 may incorporate a pair of ultrasonic plates 716 (one on either side of the channel) for providing ultrasonic energy to the cleaning fluid for efficient cleaning of particle stains present in the system 700. The ultrasonic plates 716 may be configured substantially the same as was discussed in FIG. 5. The cleaning module 710 may further include a receptacle 718 for holding the cleaning fluid after it has been used to clean the portion of the system 700. The receptacle 718 may include a drain 720 for removing the used cleaning fluid from the system 700. The cleaning module 710 may further include a pair of air knives 722 for providing a stream of air pressure. The air knives 722 may be positioned on either side of the cleaning module to prevent the cleaning fluid from spreading away from the cleaning target.

Figure 8:
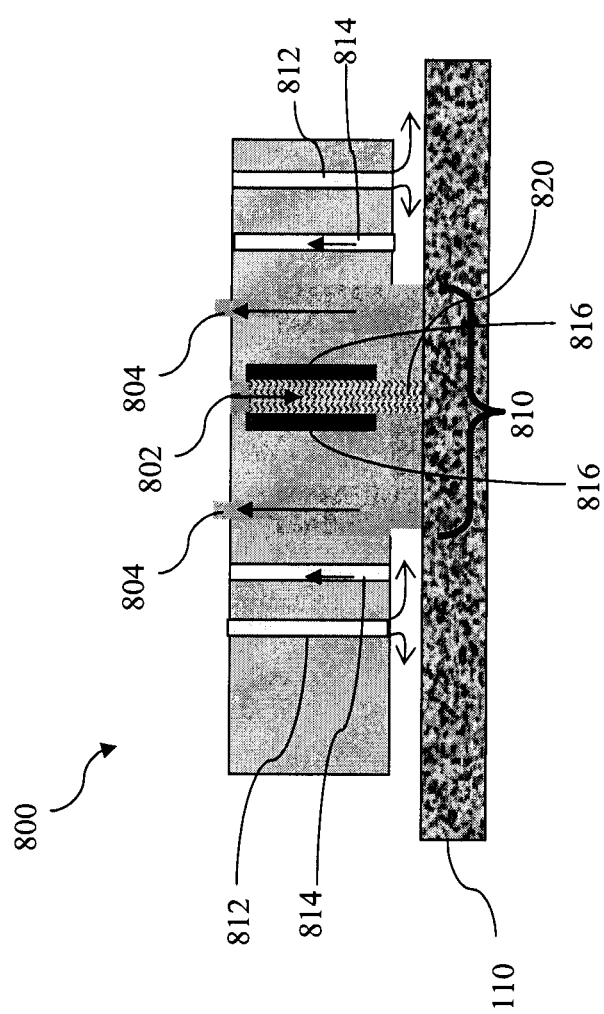
FIGS. 8 through 10 illustrate schematic views of various embodiments of a cleaning module for cleaning various components of an immersion lithography system.

Now referring to FIG. 8, illustrated is one embodiment of a cleaning module 800 adapted to clean various components of the immersion lithography system 100 of FIG. 1. In the present example, the cleaning module 800 is shown cleaning the substrate table 110 of FIG. 1. The cleaning module 800 may be integrated with the immersion hood, such as with the lens system 120 or the immersion fluid retaining module 130. Alternatively, the cleaning module 800 may be configured as a separate apparatus for cleaning the system 100 online and/or offline. The cleaning module 800 may be positioned between 0.1 mm to about 1 cm away from the cleaning target 810 so as not to damage the system 100.

The cleaning module 800 may comprise a fluid inlet 802 and a pair of fluid outlets 804 for providing a cleaning fluid to and from the cleaning target 810. The inlet 802 and outlets 804 may be controlled by valves and pumps such that a flow of cleaning fluid may be provided to the cleaning target 810. The outlets 804 may be configured with appropriate suction to prevent the cleaning fluid from leaking away from the cleaning target 810. The time period for the flow of cleaning fluid may vary depending on the cleaning recipe. The cleaning fluid may be the same as was discussed in FIG. 5. The cleaning module 800 may further include a pair of purge lines 812 and extraction lines 814 for providing a flow of air (at a pressure greater than a process working pressure) to further aid in preventing the cleaning fluid from escaping the cleaning space 810. Additionally, the flow of air may also be used to dry the substrate table 110 during and/or after the cleaning process. Alternatively, other types of gases may be used such as nitrogen, argon, compressed dry air, and other suitable gases.

The cleaning module 800 may further include a pair of ultrasonic plates 816 (one on either side of inlet 802) for providing ultrasonic energy 820 to the cleaning fluid for efficient cleaning of particle stains present on the substrate table 110. The ultrasonic plates 816 may be configured substantially the same as was discussed in FIG. 5. Even though the cleaning module 800 is shown cleaning the substrate table 110, it is understood that the cleaning module may be implemented to clean other components of the system 100.

Figure 9:
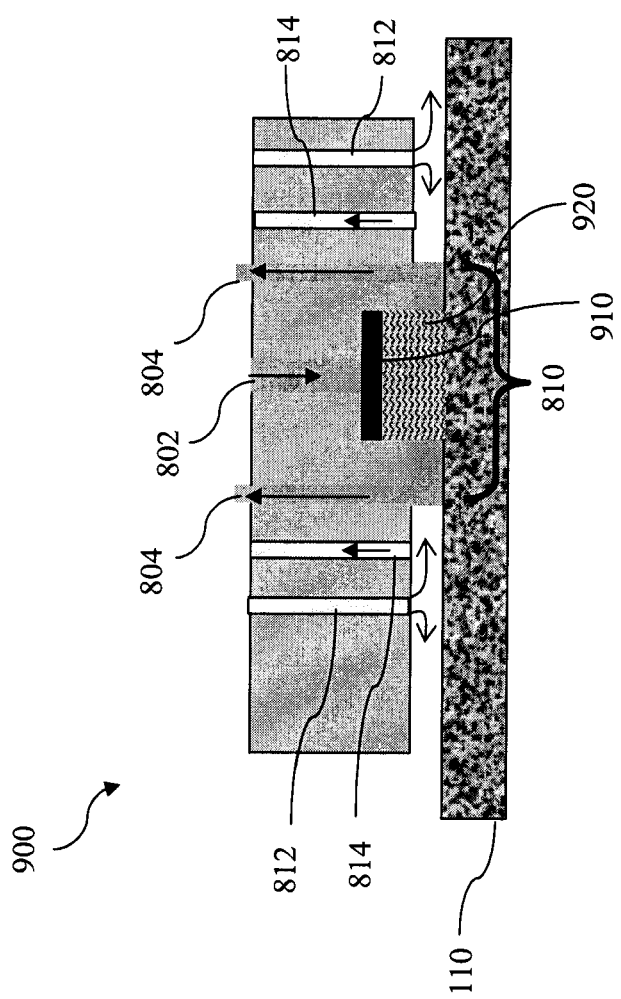

Now referring to FIG. 9, illustrated is another embodiment of a cleaning module 900 adapted to clean various components of the immersion lithography system 100 of FIG. 1. The cleaning module 900 is substantially similar to the cleaning module 800 of FIG. 8 except for the ultrasonic feature. Similar features in FIGS. 8 and 9 are numbered the same for simplicity and clarity. The cleaning module 900 may comprise an ultrasonic unit 910 for providing ultrasonic energy 920 to the cleaning fluid for efficient cleaning of particle stains present in the system 100. The ultrasonic unit 910 may include a single plate structure as shown. The ultrasonic unit 910 may be configured substantially the same as was discussed in FIG. 5.

Figure 10:
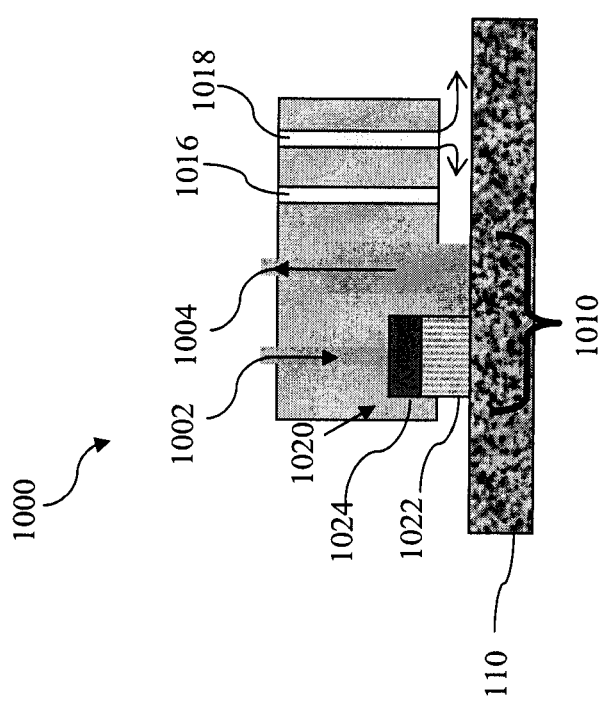

Now referring to FIG. 10, illustrated is another embodiment of a cleaning module 1000 adapted to clean various components of the immersion lithography system 100 of FIG. 1. In the present example, the cleaning module 1000 is shown cleaning the substrate table 110 of FIG. 1. The cleaning module 1000 may be integrated with the immersion hood, such as with the lens system 120 or the immersion fluid retaining module 130. Alternatively, the cleaning module 1000 may be configured as a separate apparatus for cleaning the system 100 online and/or offline. The cleaning module 1000 may comprise a fluid inlet 1002 and a fluid extractor 1004 for providing a cleaning fluid to and from a cleaning target 1010. The fluid inlet 1002 and fluid extractor 1004 may be controlled by valves and pumps such that a flow of cleaning fluid may be provided to and from the cleaning target 1010. The cleaning fluid may be substantially the same as was discussed in FIG. 5.

The fluid inlet 1002 may be fluidly coupled to a cleaning scrubber 1020. The cleaning scrubber 1020 may include a cleaning head 1022. The cleaning head 810 may be designed as a sponge, a fiber-like brush, or other suitable structures. The cleaning head 1022 may include a material selected from the group consisting of polyethylene (PE), polyvinyl alcohol (PVA), polypropylene (PP), mohair, and combinations thereof. The cleaning head 1022 may further include a transportation path for delivering the cleaning fluid.

The cleaning scrubber 1020 may include a motor 1024 to drive the cleaning head 1022 in various movements. For example, the various movements include rotation, vibration, transitional vibration, or combinations thereof. The rotation speed may range between about 1 rpm and 1000 rpm. The motor 1024 may also remain static without rotation. The vibration movement may have a frequency ranging between about 0.5 Hz and 5000 Hz. The transitional vibration movement may have a frequency ranging between about 0.5 Hz and 5000 Hz. The cleaning scrubber 1020 may further include an ultrasonic unit (not shown) integrated therewith to introduce ultrasonic energy to the cleaning fluid. The ultrasonic unit may be substantially similar to the ultrasonic unit discussed in FIG. 5.

Figure 11A:
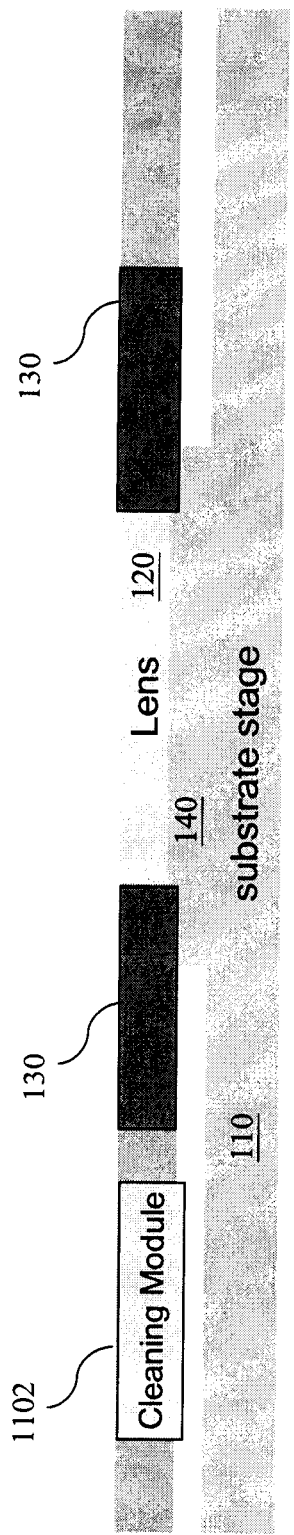
FIGS. 11a and 11b illustrate schematic views of various embodiments of one of the cleaning modules of FIGS. 5 through 10 integrated with the immersion lithography system of FIG. 1.
Figure 11B:
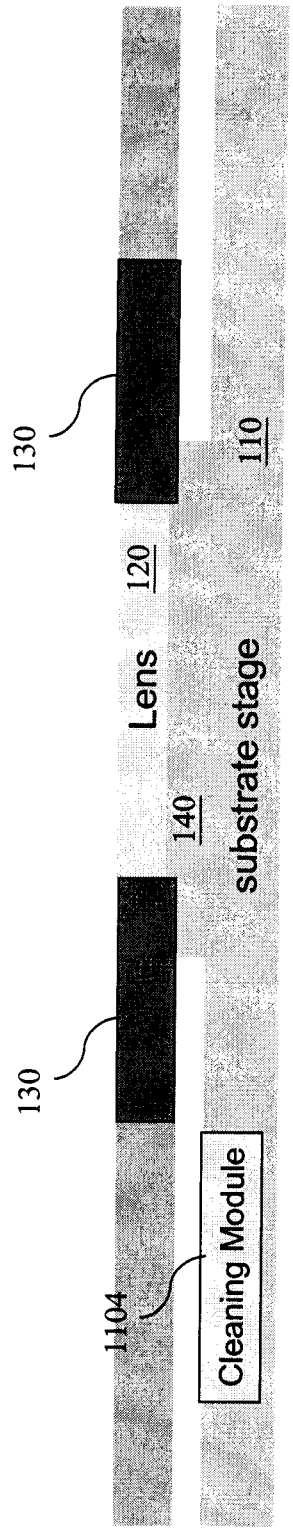

Referring now to FIGS. 11a and 11b, illustrated are various embodiments of one of the cleaning modules of FIGS. 5 through 10 implemented in the immersion lithography system of FIG. 1. As previously discussed, the cleaning modules of FIGS. 5 through 10 may be integrated with the immersion lithography system 100. In FIG. 11a, a cleaning module 1102 may integrated with the immersion hood proximate to the immersion fluid retaining module 130. In this way, the cleaning module 1102 may be used to clean the substrate table 110 as it moves in various positions. In FIG. 11b, a cleaning module 1104 may be integrated with the substrate table 110. In this way, the cleaning module 1104 may be used to clean components of the immersion hood, such as the lens system 120 and/or the immersion fluid retaining module 130. The cleaning module 1104 may be precisely moved and controlled via the substrate table 110.

Referring now to FIGS. 12a through 12c, illustrated are various embodiments of a robot 1210a, 1210b, 1210c incorporating a cleaning module 1212. As previously discussed, the cleaning modules of FIGS. 5 through 10 may be configured as a separate apparatus for cleaning components of an immersion lithography system 100 of FIG. 1. Accordingly, the cleaning module 1212 may be similar to one or more cleaning modules discussed in FIGS. 5 through 10. The robot 1210a, 1210b, 1210c may be operable to realize various movements and patterns for cleaning the system 100. The robot 1210 including the cleaning module 1212 may be utilized to clean an immersion fluid retaining module 130 as illustrated in FIG. 13a, a lens system 120 as illustrated in FIG. 13b, and/or a substrate table 110 wherein a substrate 112 may be positioned as illustrated in FIG. 13c. The robot 1210 including the cleaning module 1212 may be operable to move to an idle location without interference with the exposure beam during an exposure process.

Various embodiments of a cleaning module described in FIGS. 5 through 12 only serve as examples for a semiconductor fabrication apparatus having a cleaning module integrated therewith. These examples are not intended to be limiting. It is understood that various combinations and/or modifications may be applied in different applications and fabrication systems.

Figure 14:
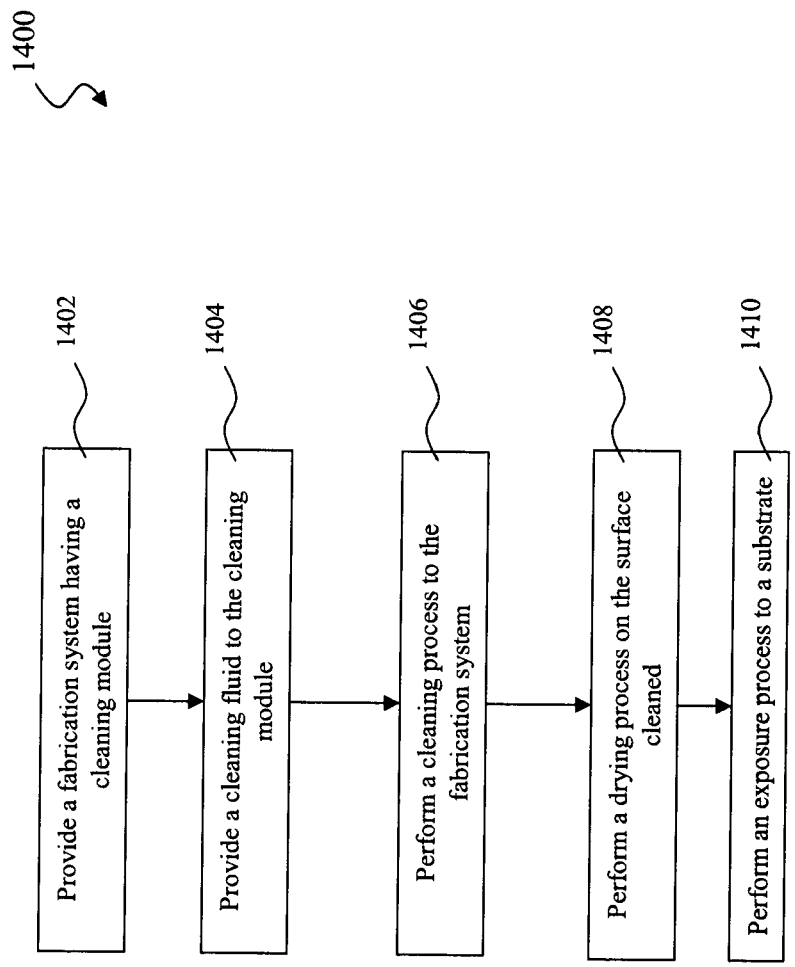
FIG. 14 is a flowchart of one embodiment of a method for cleaning a lithography system utilizing one of the cleaning modules of FIGS. 5 through 12.

Referring now to FIG. 14, illustrate is a flowchart of one exemplary method 1400 for cleaning a semiconductor fabrication apparatus using one or more of the cleaning modules of FIGS. 5 through 12. The method 1400 may begin at step 1402 in which a semiconductor fabrication apparatus having a cleaning module is provided. The semiconductor fabrication apparatus may be an immersion lithography system, or alternatively, a dry lithography system, or a semiconductor fabrication apparatus such as a physical vapor deposition (sputtering) system, or a chemical vapor deposition system. The cleaning module may include ultrasonic units configured in various embodiments illustrated in FIGS. 5 through 12. The cleaning module may be integral to an immersion fluid retaining module, a substrate table, or may be a separate or stand alone module.

The method 1400 continues with step 1404 in which a cleaning fluid is provided through the cleaning module. The cleaning fluid may include DIW, $CO_2$ water, surfactant, solvent, $NH_4OH$, $H_2O_2$, $O_3$, PGME/PGMEA (propylene glycol monomethyl ether/Propylene glycol monomethyl ether acetate), cyclohexanol, Isopropyl alcohol (IPA), acetone, alcohol, monoethanolamine (MEA) or combinations thereof. The cleaning fluid may have a temperature ranging between about 23° C. and 70° C. An exemplary cleaning fluid recipe may include DIW followed by a chemical solution followed by DIW. Another exemplary cleaning fluid may include $NH_4OH/H_2O_2/H_2O$.

The method 1400 continues with step 1406, the method 1400 performs a cleaning process to clean components of the semiconductor fabrication apparatus, such as to clean a lens system, a substrate table, and/or an immersion fluid retaining module in an immersion lithography system. Other exemplary components to be cleaned may include a wafer robot or walls of a processing chamber. During the cleaning process, the cleaning module may move in various patterns. Additionally, various features or functions of the cleaning module may be synchronically turned on and work together. For example, acoustic energy, such as ultrasonic energy (or referred to as megasonic energy for very high frequencies), may be introduced into the cleaning fluid according to various cleaning recipes for different cleaning applications. The acoustic energy may have a power range from 10 watt to about 1000 watt and a frequency range from 1 KHz to 1 GHz. The acoustic energy may be provided for a duration ranging from 2 seconds to about 30 minutes. Steps 1404 and 1406 may be combined to perform the cleaning process. The method 1400 may perform a DIW rinsing process after the cleaning process.

The method 1400 continues with step 1408 in which a drying process is performed to the surfaces (or the components) cleaned in the previous steps. The drying process 1408 may include delivering a purge gas through the cleaning module. The purge gas may include argon, nitrogen, compressed dry air, or other suitable gas. The drying process may alternatively or collectively be implemented using other liquids such as IPA.

At step 1410, after the cleaning is completed, a substrate such as a semiconductor substrate may be loaded and positioned on a substrate table for normal semiconductor processing such as an immersion lithography exposure, a dry lithography exposure, a thin film deposition, or other processes operable in the associated system. The cleaning process from step 1404 to step 1408 may be implemented at a predefined schedule for tool maintenance, or after a certain number of wafers have been processed through, or when other inspection data, test data, and/or qualification data show certain degradation.

Thus, the present disclosure provides a lithography apparatus. The apparatus includes an imaging lens module; a substrate table positioned underlying the imaging lens module and configured to hold a substrate; and a cleaning module adapted to clean the lithography apparatus. The cleaning module comprises at least one inlet at least one inlet and at least one outlet for providing a cleaning fluid to and from a portion of the lithography apparatus to be cleaned and an ultrasonic unit configured to provide ultrasonic energy to the cleaning fluid. In some embodiments, the apparatus further includes an immersion fluid retaining module configured to provide an immersion fluid to a space between the imaging lens module and a substrate on the substrate table. In other embodiments, the cleaning module is operable to clean at least one of the imaging lens module, the substrate table, and the immersion fluid retaining module. In still other embodiments, the cleaning module is integrated with at least one of the immersion fluid retaining module and the substrate table. In other embodiments, the cleaning module is integrated with a robot.

In some embodiments, the cleaning module further comprises an air knife and an air extractor for providing hydrodynamic control of the cleaning fluid provided to and from the portion of the lithography apparatus to be cleaned. In other embodiments, the ultrasonic unit is operable to provide an ultrasonic energy with a power ranging between 10 watt to about 1000 watt and a frequency ranging between 1 KHz to about 1 GHz. In other embodiments, the cleaning fluid is selected from a group consisting of: a chemical solution, de-ionized water (DIW), $CO_2$ water, and combinations thereof. In other embodiments, the chemical solution comprises a material selected from a group consisting of: a surfactant, solvent, $NH_4OH$, $H_2O_2$, $O_3$, PGME/PGMEA cyclohexanol, IPA, acetone, alcohol, MEA, and combinations thereof.

The present disclosure also provides an immersion lithography apparatus. The apparatus includes an imaging lens module; a substrate table configured to secure a substrate and positioned underlying the imaging lens; a fluid retaining module configured to provide a fluid to a space between the imaging lens module and a substrate on the stage; and a cleaning module configured to clean the immersion lithography apparatus, wherein the cleaning module comprises at least one fluid inlet for providing a cleaning fluid to a cleaning target and at least one fluid outlet for removing the cleaning fluid from the cleaning target. In some embodiments, the cleaning module is positioned 0.1 mm to about 1 cm away from the cleaning target.

In other embodiments, the cleaning module further comprises a cleaning scrubber. In some other embodiments, the cleaning scrubber comprises a material selected from a group consisting of: polyethylene (PE), polyvinyl alcohol (PVA), polypropylene (PP), mohair, and combinations thereof. In still other embodiments, the cleaning module further comprises an ultrasonic unit operable to provide ultrasonic energy to the cleaning fluid during a cleaning process; a purge line and an extractor line for drying the cleaning target by providing a gas to and from the cleaning target. In some embodiments, the gas is selected from a group consisting of: nitrogen, argon, and compressed dry air.

Also, the present disclosure also provides a method including the steps of providing a lithography apparatus having a cleaning module, wherein the cleaning module is configured to include at least one inlet and at least one outlet for providing a cleaning fluid to and from a portion of the lithography apparatus to be cleaned; performing a cleaning process to the portion of the lithography apparatus by utilizing the cleaning module; and performing an exposure process to a substrate coated with an imaging layer. In some embodiments, the step of performing a cleaning process includes providing acoustic energy to the cleaning fluid during the cleaning process, wherein the acoustic energy is configured with a power ranging between 10 watt to about 1000 watt and a frequency ranging between 1 KHz to about 1 GHz. In other embodiments, the step of the performing the cleaning process includes performing the cleaning process for a duration ranging between 2 seconds to about 30 minutes. In still other embodiments, the step of the performing the cleaning process includes configuring the cleaning fluid to include a chemical solution, de-ionized water (DIW), $CO_2$ water, or combinations thereof. In other embodiments, the method further includes the step of performing a rinsing process and drying process on the portion of the lithography apparatus that was cleaned.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A lithography apparatus, comprising:
an imaging lens module;
a substrate table positioned underlying the imaging lens module and configured to hold a substrate; and
a cleaning module adapted to clean the lithography apparatus, wherein the cleaning module comprises:
at least one inlet and at least one outlet for providing a cleaning fluid to and from a portion of the lithography apparatus to be cleaned; and
an ultrasonic unit configured to provide ultrasonic energy to the cleaning fluid, wherein the ultrasonic unit includes a first ultrasonic plate on a first side of the at least one inlet and a second ultrasonic plate on an opposing second side of the at least one inlet such that the cleaning fluid flows between the first and second ultrasonic plates,
wherein the cleaning module is integrated with at least one of the imaging lens module and the substrate table.

2. The apparatus of claim 1, further comprising an immersion fluid retaining module configured to provide an immersion fluid to a space between the imaging lens module and a substrate on the substrate table.

3. The apparatus of claim 2, wherein the cleaning module is operable to clean at least one of the imaging lens module, the substrate table, and the immersion fluid retaining module.

4. The apparatus of claim 1, wherein the cleaning module further comprises an air knife and an air extractor for providing hydrodynamic control of the cleaning fluid provided to and from the portion of the lithography apparatus to be cleaned.

5. The apparatus of claim 1, wherein the ultrasonic unit is operable to provide an ultrasonic energy with a power ranging between 10 watt to about 1000 watt and a frequency ranging between 1 KHz to about 1 GHz.

6. The apparatus of claim 1, wherein the cleaning fluid is a material selected from the group consisting of a chemical solution, de-ionized water (DIW), $CO_2$ water, and combinations thereof.

7. The apparatus of claim 6, wherein the chemical solution is a material selected from the group consisting of a surfactant, solvent, $NH_4OH$, $H_2O_2$, $O_3$, PGME/PGMEA cyclohexanol, IPA, acetone, alcohol, MEA, and combinations thereof.

8. The apparatus of claim 1, wherein the cleaning fluid includes a chemical solution that forms a charged layer on at least the portion of the lithography apparatus to be cleaned such that a particle removed from the portion of the lithography apparatus during cleaning has a portion of the charged layer.

9. The apparatus of claim 8, wherein the particle having the portion of the charged layer is repelled away from the charged layer on at least the portion of the lithography apparatus to be cleaned.

10. An immersion lithography apparatus, comprising:
an imaging lens module;
a substrate table configured to secure a substrate and positioned under the imaging lens;
a fluid retaining module configured to provide a fluid to a space between the imaging lens module and the substrate on the table, wherein the fluid retaining module is integrated with the imaging lens module; and
a cleaning module, separate from the fluid retaining module, configured to clean the immersion lithography apparatus, wherein the cleaning module comprises at least one fluid inlet for providing a cleaning fluid to a cleaning target and at least one fluid outlet for removing the cleaning fluid from the cleaning target, wherein the at least one fluid inlet includes a first fluid inlet pathway and a different second fluid inlet pathway, wherein the cleaning module includes an ultrasonic unit that defines a first portion of the first fluid inlet pathway and a second portion of the second fluid inlet pathway and is configured to provide ultrasonic energy to the cleaning fluid flowing through the first and second fluid inlet pathways.

11. The apparatus of claim 10, wherein the cleaning module is positioned about 0.1 mm to about 1 cm away from the cleaning target.

12. The apparatus of claim 10, wherein the cleaning module further comprises a cleaning scrubber.

13. The apparatus of claim 12, wherein the cleaning scrubber is a material selected from the group consisting of polyethylene (PE), polyvinyl alcohol (PVA), polypropylene (PP), mohair, and combinations thereof.

14. The apparatus of claim 10, wherein the cleaning module further comprises:
a purge line and an extractor line for drying the cleaning target by providing a gas to and from the cleaning target.

15. The apparatus of claim 14, wherein the gas is selected from the group consisting of nitrogen, argon, and compressed dry air.

16. A method, comprising:
providing a lithography apparatus having:
an imaging lens module;
a cleaning module, wherein the cleaning module is configured to include at least one inlet and at least one outlet for providing a cleaning fluid to and from a portion of the lithography apparatus to be cleaned, wherein the cleaning module further includes a plurality of ultrasonic plates configured to provide ultrasonic energy to the cleaning fluid, wherein the at least one inlet includes a plurality of fluid channels that are defined by the plurality of ultrasonic plates, and a fluid retaining module, separate from the cleaning module, configured to provide a fluid to a space between the imaging lens module and the substrate on the table;

performing a cleaning process to the imaging lens module of the lithography apparatus by utilizing the cleaning module; and performing an exposure process to a substrate coated with an imaging layer.

17. The method of claim 16, wherein the performing a cleaning process includes providing acoustic energy to the cleaning fluid during the cleaning process, wherein the acoustic energy is configured with a power ranging between about 10 watt to about 1000 watt and a frequency ranging between about 1 KHz to about 1 GHz.

18. The method of claim 17, wherein the performing the cleaning process includes performing the cleaning process for a duration ranging between about 2 seconds to about 30 minutes.

19. The method of claim 18, wherein the performing the cleaning process includes configuring the cleaning fluid to include a chemical solution, de-ionized water (DIW), $CO_2$ water, or combinations thereof.

20. The method of claim 16, further comprising performing a rinsing process and drying process on the portion of the lithography apparatus that was cleaned.

* * * * *